(12) United States Patent
Takeyama (10) Patent No.: US 7,537,670 B2
(45) Date of Patent: May 26, 2009

(54) THERMAL CONTACT-BONDING METHOD AND THERMAL CONTACT-BONDING APPARATUS

(75) Inventor: Yoshifumi Takeyama, Shiga (JP)

(73) Assignee: Canon Kabushiki Kaisha, Tokyo (JP)

( * ) Notice: Subject to any disclaimer, the term of this patent is extended or adjusted under 35 U.S.C. 154(b) by 407 days.

(21) Appl. No.: 10/938,719

(22) Filed: Sep. 13, 2004

(65) Prior Publication Data
US 2005/0056363 A1    Mar. 17, 2005

(30) Foreign Application Priority Data
Sep. 16, 2003 (JP) .............................. 2003-322563

(51) Int. Cl.
B32B 37/00 (2006.01)
(52) U.S. Cl. .................. 156/285; 156/212; 156/382; 156/583.3
(58) Field of Classification Search ............ 156/285, 156/382, 381, 212, 583.3
See application file for complete search history.

(56) References Cited

U.S. PATENT DOCUMENTS

| | | | | |
|---|---|---|---|---|
| 4,260,429 A | | 4/1981 | Moyer | 136/256 |
| 4,447,282 A | * | 5/1984 | Valerio et al. | 156/285 |
| 5,234,665 A | | 8/1993 | Ohta et al. | 422/73 |
| 5,667,596 A | | 9/1997 | Tsuzuki et al. | 136/256 |
| 5,942,048 A | | 8/1999 | Fujisaki et al. | 136/256 |
| 6,008,451 A | * | 12/1999 | Ichinose et al. | 136/256 |
| 6,114,185 A | | 9/2000 | Tsuzuki et al. | 438/51 |
| 6,162,986 A | | 12/2000 | Shiotsuka et al. | 136/244 |
| 6,180,868 B1 | | 1/2001 | Yoshino et al. | 136/244 |
| 6,367,530 B1 | * | 4/2002 | Shimotomai | 156/382 |
| 6,481,482 B1 | * | 11/2002 | Shimotomai | 156/366 |
| 6,685,789 B1 | * | 2/2004 | Wissing | 156/212 |

FOREIGN PATENT DOCUMENTS

| | | |
|---|---|---|
| JP | 56-45768 | 10/1981 |
| JP | 57-105310 | 6/1982 |
| JP | 04-029037 | 1/1992 |
| JP | 5-31743 | 2/1993 |
| JP | 05-131545 | 5/1993 |
| JP | 7-335921 | 12/1995 |
| JP | 8-139349 | 5/1996 |
| JP | 8-306946 | 11/1996 |
| JP | 09-057779 | 3/1997 |
| JP | 2000-286437 | 10/2000 |
| JP | 2002-347115 | 12/2002 |

* cited by examiner

Primary Examiner—John L Goff
(74) Attorney, Agent, or Firm—Fitzpatrick, Cella, Harper & Scinto (57) ABSTRACT

A thermal contact-bonding method employs a thermal contact-bonding apparatus including at least a hot plate, an upper chamber, and a resin sheet provided at a lower portion of the upper chamber. The method includes the steps of pressing the upper chamber against the hot plate, while at least a part of a surface of the hot plate is separated from the resin sheet, to be in a stand-by state of the thermal contact-bonding apparatus, for a time of not charging a material to be processed, charging the material to be processed between the resin sheet and the hot plate, and subjecting the material to be processed to a thermal contact-bonding processing by making a space between the resin sheet and the hot plate under a vacuum state.

3 Claims, 9 Drawing Sheets

THERMAL CONTACT-BONDING METHOD AND THERMAL CONTACT-BONDING APPARATUS

BACKGROUND OF THE INVENTION

1. Field of the Invention

The present invention relates to a thermal contact-bonding apparatus such as a vacuum press, a vacuum hot press, or a double vacuum apparatus. The present invention more specifically relates to a method and an apparatus for thermally contact-bonding a surface of a material to be processed which is brought into contact with a resin sheet in a clean state.

2. Related Background Art

A thermal contact-bonding apparatus such as a vacuum press, a vacuum hot press, or a double vacuum apparatus is suitably used for laminate molding of an outer surface of a molded substrate having a three-dimensional shape including a cabinet for audio or visual equipment, furniture, and a container by bonding a decorative sheet such as a transfer sheet or an adhesive sheet along the outer surface of such a molded substrate, for example, for surface finishing such as decoration.

For example, as a method of bonding and laminating a decorative sheet on an outer surface of a molded substrate, a method disclosed by Japanese Patent Publication No. S56-045768 or the like is known which includes dividing an upper chamber and a lower chamber with a decorative sheet; pressing the upper chamber while reducing a pressure of the lower chamber provided with a molded substrate by vacuum sucking to cause a pressure difference between the chambers, and heating and softening the decorative sheet substantially at the same time to bond the decorative sheet along an outer surface of the molded substrate. The lamination method assumes that the decorative sheet be generally an adhesive sheet, but the lamination method can also be employed in a case where the decorative sheet is a transfer sheet. In this case, a transfer portion is bonded, and then a release substrate sheet alone is peeled off while the transfer portion remains.

The above-mentioned thermal contact-bonding method involves pressing a decorative sheet against a molded substrate by a pressure difference alone. Thus, pressing force of the decorative sheet against the molded substrate may be insufficient or may be partially uneven. A decorative sheet cannot be completely adhered to uneven portions or curving portions of a molded substrate having a large height difference in uneven portions provided on an outer surface or having a large curvature at edge portions or localized portions of the outer surface. Thus, bonding failure easily occurs.

A thermal contact-bonding method is proposed to solve such problems mentioned above. A method disclosed in Japanese Patent Application Laid-Open No. S57-105310 or the like involves, for example, heating an elastic cover member of silicone rubber or the like with radiation heat to a predetermined temperature by providing a heater in a sheet-side chamber and heating the sheet-inside chamber; lowering the sheet-side chamber toward a suction holder having a work and a sheet placed thereon; while sucking the elastic cover member and the sheet under vacuum along a curve shape of the work, pressurizing the inside of the sheet-side chamber to bring the elastic cover member into contact with the sheet and pressurizing the both.

There has been proposed methods employing such a thermal contact-bonding method such as a method of bonding a decorative sheet of a synthetic resin having a pattern or the like printed thereon to an outer surface of wood, metal, or the like; a method of producing a curving multilayer wiring board used for antennas, mobile communication, or the like; and a method of producing an IC lead frame having a composite structure of a conductive metal sheet and an insulating material sheet laminated on each other.

Further, Japanese Patent Application Laid-Open Nos. H07-335921 and H08-306946 discloses a method of forming an electrode for a photovoltaic device such as a solar cell by using a thermal contact-bonding method.

A typical structure of the photovoltaic device includes: a semiconductor layer having a p-n junction; a light receiving surface electrode of a transparent conductive oxide formed on a light receiving surface of the semiconductor layer; a collecting electrode consisting of a relatively thin metal for collecting a current on the light receiving surface electrode; and an electrode consisting of a relatively thick metal called "busbar" for collecting the current collected at the collecting electrode.

An electrode structure of the photovoltaic device as disclosed in, for example, U.S. Pat. No. 4,260,429 has been proposed, and this structure includes an electrode consisting of a metal wire coated with a polymer containing conductive particles, for example. An invention described in U.S. Pat. No. 4,260,429 allows a small electrical resistance loss even when a metal wire having good conductivity such as copper is used to form a long collecting electrode, and an aspect ratio of 1:1, whereby a shadow loss can also be reduced. A wire can be fixed by bonding through a simple thermal contact-bonding method using a conductive adhesive.

Figure 5A:
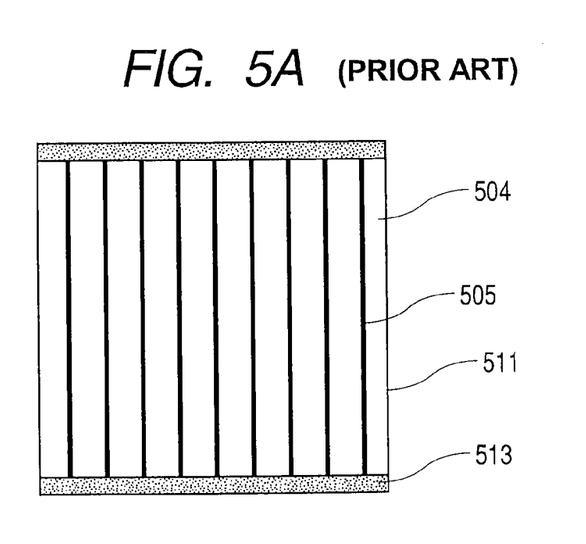
FIGS. 5A and 5B are schematic views illustrating a photovoltaic device provided with an electrode by thermal contact-bonding.
Figure 5B:
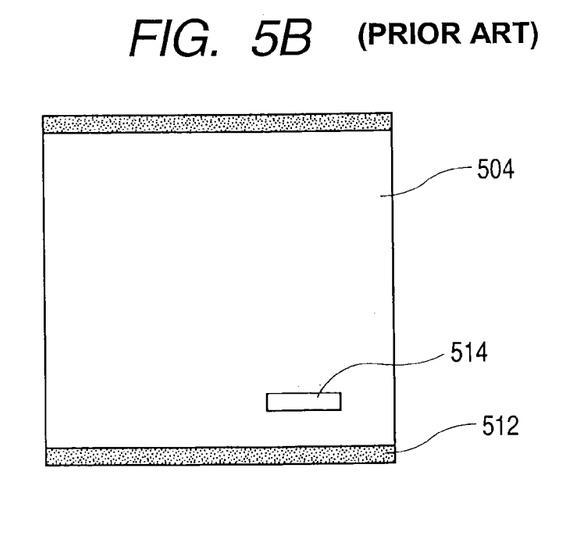

A specific example of a method of forming an electrode for a photovoltaic device will be described with reference to FIGS. 5A to 5B and 6A to 6I. FIGS. 5A to 5B are schematic diagrams each showing a structure of a photovoltaic device, which is a material to be processed. FIG. 5A is a schematic diagram of the photovoltaic device seen from a light-receiving surface side, and FIG. 5B is a schematic diagram of the photovoltaic device seen from a non-light-receiving surface side.

In FIGS. 5A and 5B, a photovoltaic device 504 (200 mm×200 mm) includes a substrate, a lower electrode layer, amorphous silicon having a photovoltaic function, and an upper electrode layer. A serial number 514 of the photovoltaic device 504 is printed in an area of 10 mm×30 mm, which is a part of a non-light-receiving surface of the photovoltaic device 504, with a continuous ink jet printer.

The photovoltaic device 504 includes: a stainless sheet having a thickness of 150 µm for supporting the entire photovoltaic device 504; and a lower electrode layer directly on the substrate formed by sequentially depositing Al and ZnO each to a thickness of several thousands Å by a sputtering process. Amorphous silicon is formed by sequentially depositing respective layers of n-type, i-type, p-type, n-type, i-type, and p-type by a plasma CVD process. The layers each have a thickness of about 150, 4,000, 100, 100, 800, and 100 Å, respectively. The upper electrode layer consists of a transparent electrode film which is an indium oxide thin film having a thickness of about 700 Å formed by depositing In in an $O_2$ atmosphere by a resistance heating process.

In order to prevent an adverse effect of a short circuit between the substrate and the transparent electrode film occurring at the time of cutting a periphery of the photovoltaic device on an effective light-receiving area, an etching paste containing $FeCl_3$, $AlCl_3$, or the like is applied to the transparent electrode film by a screen printing process, heated, and washed. Thus, a part of the transparent electrode member of the photovoltaic device 504 is linearly removed to form an etching line 511.

Then, a copper foil strip (length: 200 mm, width: 5 mm, thickness: 100 µm), which is a back surface side conductive foil member 512, is formed on two edge portions of the non-light receiving surface side of the photovoltaic device 504 by a method disclosed in Japanese Patent Application Laid-Open No. H08-139349.

An insulating two-sided adhesive tape (not shown) having a polyimide base member (length: 200 mm, width: 5 mm, thickness: 50 μm) is applied on two edge portions of the light-receiving surface side of the photovoltaic device 504, two edge portions facing the back surface side conductive foil member. A conductive adhesive-applied metal wire 505 prepared in advance by applying a conductive adhesive consisting of a carbon paste on a copper wire of Φ 100 μm is continuously formed on the photovoltaic device 504 and the insulating two-sided adhesive tape at a pitch of 20 mm, to thereby form a collecting electrode. Further, a conductive foil member 513, which is an electrode for collecting the collecting electrodes, is formed on the insulating two-sided adhesive tape. To be specific, a copper foil strip (length: 200 mm, width: 5 mm, thickness: 100 μm) is arranged on the insulating two-sided adhesive tape, and the whole is subjected to heat and pressure fixing under the conditions of 200° C., 0.098 MPa, and 120 seconds.

FIGS. 6A to 6I are sectional schematic diagrams each showing a thermal contact-bonding apparatus for realizing the above-mentioned heat and pressure fixing. In FIGS. 6A to 6I, reference numeral 601 denotes an upper chamber; 602, a resin sheet; 603, a hot plate provided with a heater inside and on which a material to be processed is placed; and 608, a lower chamber.

Figure 6A:
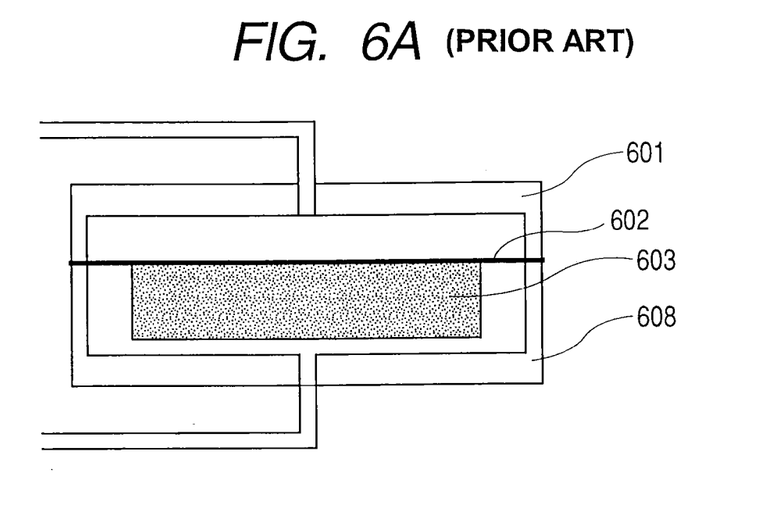
FIGS. 6A, 6B, 6C, 6D, 6E, 6F, 6G, 6H and 6I are schematic sectional views illustrating a conventional thermal contact-bonding method.

The thermal contact-bonding apparatus stands by at the state that the upper chamber 601 is lowered, and the upper chamber 601, the lower chamber 608, and the resin sheet 602 are heated by the hot plate 603 (FIG. 6A).

Figure 6B:
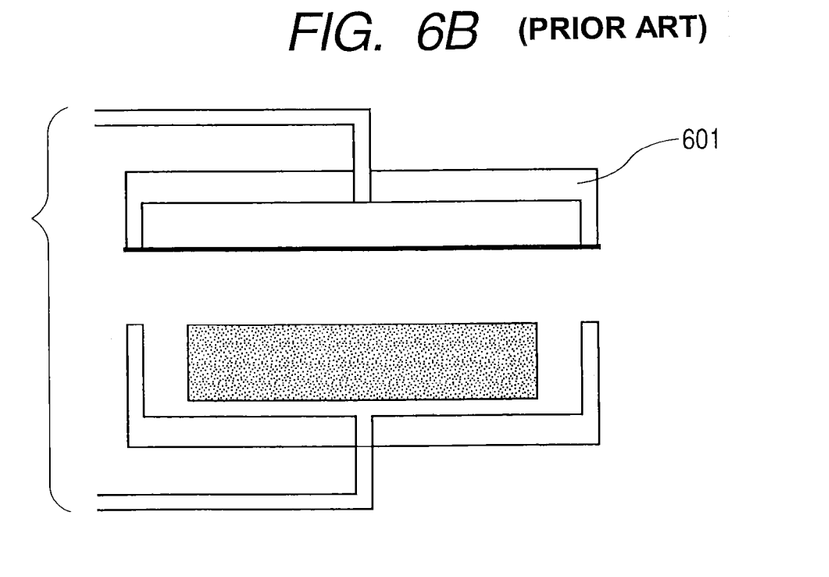
Figure 6C:
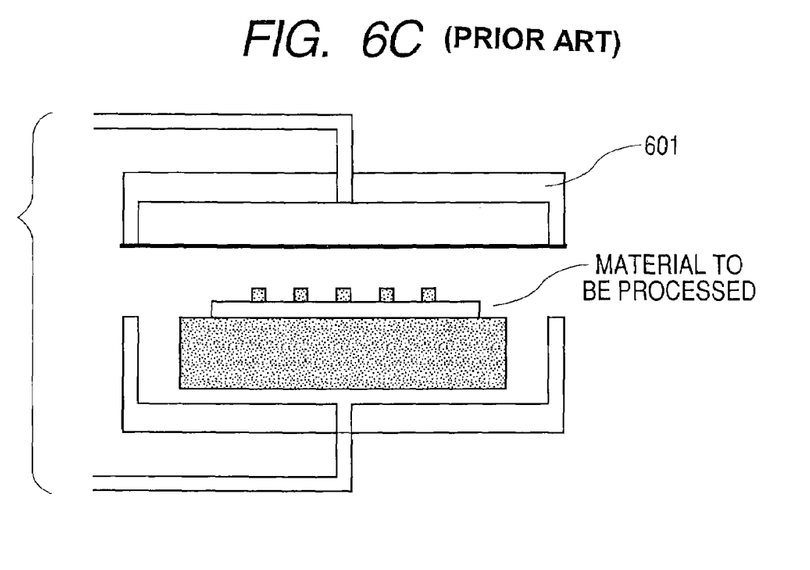

Next, the upper chamber 601 is raised in order to carry a photovoltaic device, which is a material to be processed, onto the hot plate. The photovoltaic device, which is a material to be processed, is carried and placed on the hot plate 603 with its collecting-electrode-formed surface facing upward (FIGS. 6B and 6C).

Figure 6D:
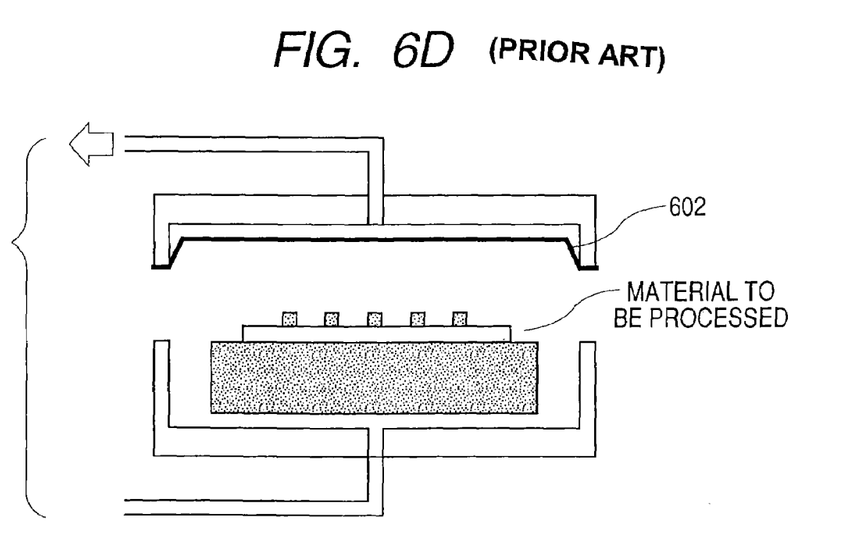
Figure 6E:
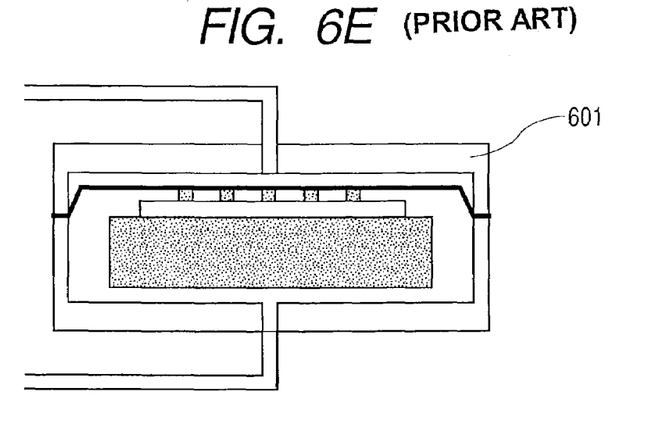
Figure 6F:
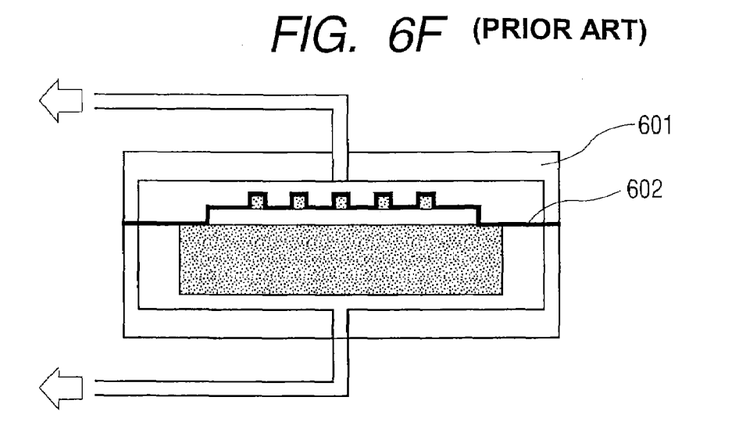

Then, the inside of the upper chamber 601 is vacuum evacuated. The upper chamber 601 is lowered. Then, the inside of the lower chamber 608 is vacuum evacuated, to thereby attach the resin sheet 602 uniformly to a surface of the material to be processed (FIGS. 6D, 6E, and 6F).

Figure 6G:
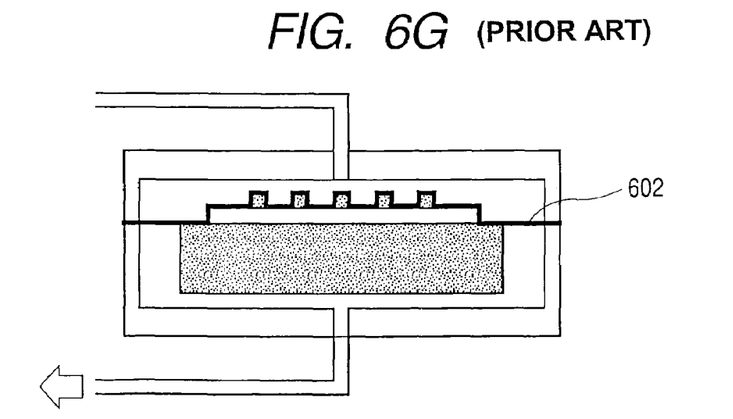

Then, the upper chamber 601 is opened to the atmosphere. The resin sheet 602 is pressed against the material to be processed at a pressure of 0.098 MPa by the atmospheric pressure while the temperature of the whole is controlled to 200° C. with the hot plate 603 to carry out a thermal contact-bonding press for 120 seconds (FIG. 6G).

Figure 6H:
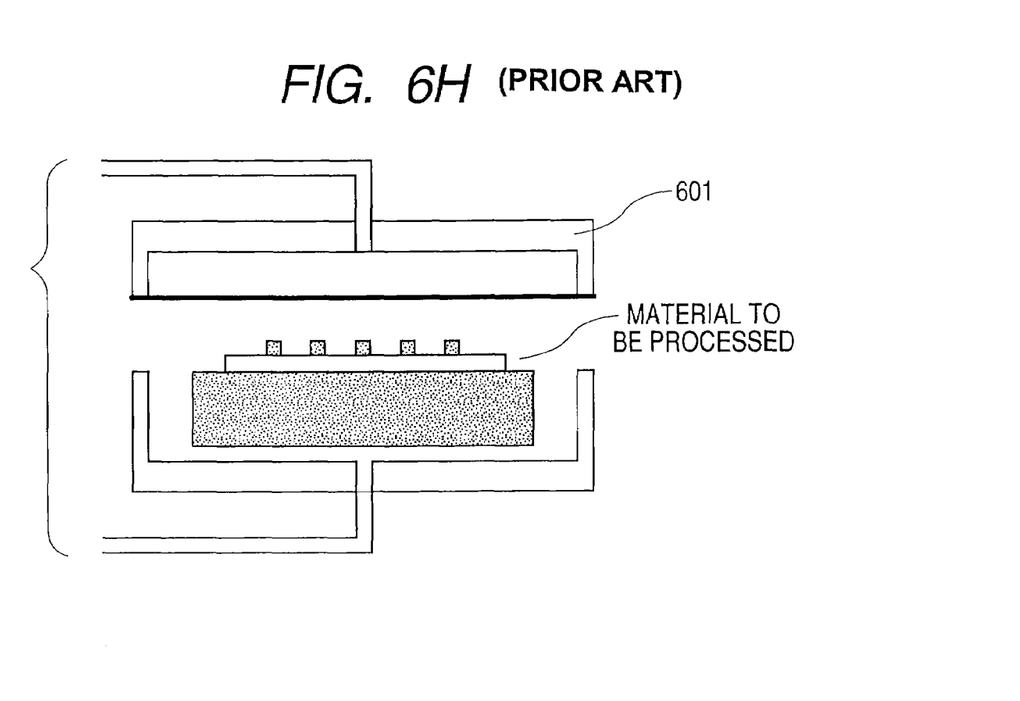
Figure 6I:
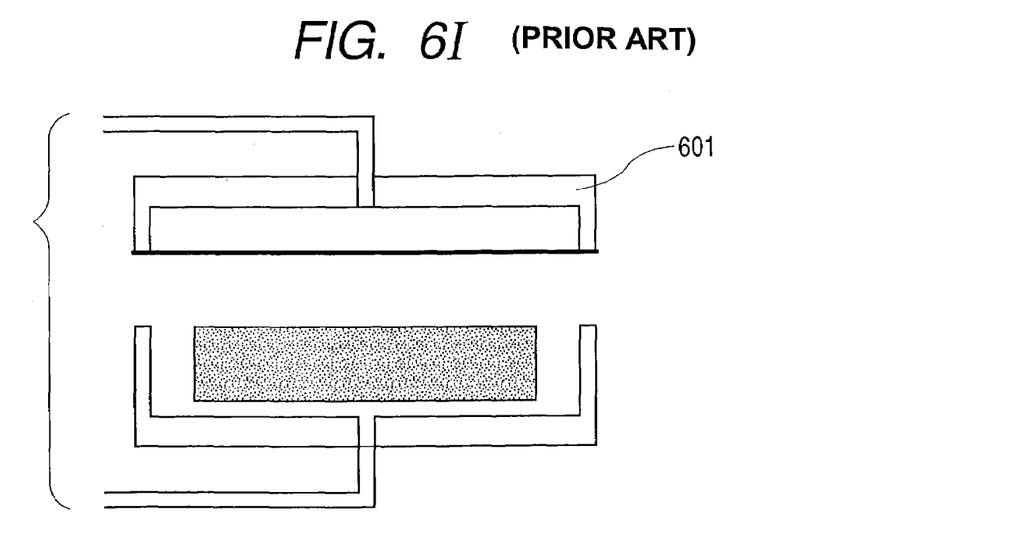

After the thermal contact-bonding press, the lower chamber 608 is opened to the atmosphere. The upper chamber 601 is then raised, and the processed material is carried out (FIGS. 6H and 6I).

After the processed material is carried out, the upper chamber 601 is then lowered and heated as shown in FIG. 6A to prevent decrease in temperatures of the upper chamber 601 and the lower chamber 608. Timings of carrying the material to be processed into and the processed material out of the thermal contact-bonding apparatus may be changed depending on pre- and post-processings taken in the thermal contact-bonding apparatus. A time period for raising the upper chamber and opening the thermal contact-bonding apparatus may also be changed in order to carrying the material to be processed into and the processed material out of the thermal contact-bonding apparatus. The temperatures of the upper and lower chambers, the resin sheet, or the like decrease during opening of the thermal contact-bonding apparatus. The upper chamber is desirably lowered when the thermal contact-bonding apparatus stands by, that is, when the material to be processed is not carried into the thermal contact-bonding apparatus, to thereby maintain a constant ambient temperature for continuous, stable thermal contact-bonding.

The above-mentioned thermal contact-bonding method involves a method of fixing a collecting electrode to a photovoltaic device by heat or pressure. Increasing the number of processing cycles of the thermal contact-bonding apparatus causes adhering of a serial number print paint or the like on the back surface of the photovoltaic device to the surface of the heating plate, adhering of the paint again from the hot plate to the resin sheet in the stand-by state of the thermal contact-bonding apparatus; and adhering of the paint adhered to the resin sheet again to the light-receiving surface of the photovoltaic device in the next thermal contact-bonding processing, thereby resulting in problems that the light-receiving surface is contaminated, and that characteristics of the photovoltaic device deteriorate significantly.

SUMMARY OF THE INVENTION

The present invention has been made to solve the above problems, and an object of the present invention is therefore to specifically provide a method and an apparatus for thermally contact-bonding a surface of a material to be processed in a clean state.

The present invention provides, as a means for solving the above problems, a thermal contact-bonding method employing a thermal contact-bonding apparatus including at least a hot plate, an upper chamber, and a resin sheet provided at a lower portion of the upper chamber, the method comprising the steps of: pressing the upper chamber against the hot plate while at least a part of a surface of the hot plate is separated from the resin sheet to be in the stand-by state of the thermal contact-bonding apparatus, for a time of not charging a material to be processed; charging the material to be processed between the resin sheet and the hot plate; and subjecting the material to be processed to a thermal contact-bonding processing by making a space between the resin sheet and the hot plate in a vacuum state.

The thermal contact-bonding method prevents contact between at least a part of a surface of a hot plate and a resin sheet even when a material to be processed is not present in a thermal contact-bonding apparatus. That is, the thermal contact-bonding method can prevent contaminant or the like deposited or adhered on the surface of the hot plate from adhering to the resin sheet which brought into direct contact with a surface of the material to be processed, and prevent the contaminant from again adhering to the surface of the material to be processed after the material to be processed is carried into the thermal contact-bonding apparatus for a thermal contact-bonding process, which causes product failure. The contaminant easily deposits on the surface of the hot plate with increasing number of processing cycles particularly when the material to be processed contains an organic substance or the like. The thermal contact-bonding method of the present invention can efficiently prevent the contaminant deposited on the surface of the hot plate from again adhering to the surface of the material to be processed via the resin sheet.

The upper chamber and the resin sheet can be heated in advance by pressing the upper chamber against the hot plate when the material to be processed is not present in the thermal contact-bonding apparatus. This makes it possible to carry out satisfactory thermal contact-bonding processing when the material to be processed is charged into the thermal contact-bonding apparatus. That is, uniformity of a heating temperature, a heating time, a heating rate, and the like is particularly important for a thermal contact-bonding process involving bonding using a thermosetting resin or the like. In the thermal contact-bonding method of the present invention, the upper chamber is always heated with the hot plate except for the time of carrying the material to be processed into and the processed material out of the thermal contact-bonding apparatus. Thus, temperature change can be efficiently controlled and a thermal contact-bonding processing can be performed under uniform temperature conditions.

The present invention provides, as a means for solving the above problems, a thermal contact-bonding method in which the surface of the hot plate and the resin sheet are separated by sucking the resin sheet toward the upper chamber side.

In the thermal contact-bonding method, the surface of the hot plate and the resin sheet can be separated by only providing a control means for sucking the resin sheet to a known thermal contact-bonding apparatus such as a double vacuum apparatus, or by adding a sucking mechanism to the upper chamber.

The present invention provides, as a means for solving the above problems, a thermal contact-bonding method in which the material to be processed has a paint printed area on a surface to be placed on the hot plate, and the surface of the hot plate and the resin sheet are separated at least on the surface of the hot plate on which the paint printed area is placed.

The thermal contact-bonding method of the present invention can be suitably employed in a thermal contact-bonding processing for a material to be processed having a paint printed on a face (back surface) to be in contact with a hot plate, not on a face (front surface) to be in contact with a resin sheet. That is, a warning label, a serial number, or the like is generally indicated on the back surface of the material to be processed such as a photovoltaic device using an organic material such as a paint, and such indications are brought in direct contact with the hot plate. The paint which is an organic material generally has poor heat resistance, and thus the print paint may be transferred to the hot plate. Measures for preventing contamination were needed for a thermal contact-bonding processing for a material to be processed having such a structure. The above-mentioned thermal contact-bonding method can prevent diffusion of a paint adhered on a hot plate even when the above-mentioned material to be processed is used.

The present invention provides, as a means for solving the above problems, a thermal contact-bonding method, in which the material to be processed includes a photovoltaic device, and a metal wire coated with at least a layer of a conductive adhesive, the metal wire being provided on the photovoltaic device by thermal contact-bonding; and the material to be processed has the paint printed area on a non-light-receiving surface (back surface) of the photovoltaic device.

An application of the thermal contact-bonding method of the present invention to the above-mentioned photovoltaic device improves productivity of photovoltaic device production. A print paint containing pigments or dyes generally has poor heat resistance, and thus a paint provided on a non-light-receiving surface (back surface) of the photovoltaic device easily adheres to the hot plate during a thermal contact-bonding process of the above-mentioned photovoltaic device. That is, the productivity of the photovoltaic device improves by applying the thermal contact-bonding method of the present invention to the above-mentioned photovoltaic device.

The present invention provides, as a means for solving the above problems, a thermal contact-bonding apparatus including at least a hot plate, an upper chamber, a resin sheet, and a control means for separating at least a part of a surface of the hot plate from the resin sheet when the upper chamber and the resin sheet are heated by pressing the upper chamber against the hot plate, in the absence of the material to be processed in the thermal contact-bonding apparatus.

The thermal contact-bonding apparatus prevents contact between at least a part of a surface of a hot plate and a resin sheet even when a material to be processed is not present in a thermal contact-bonding apparatus. That is, the thermal contact-bonding apparatus can prevent contaminant or the like deposited or adhered on the surface of the hot plate from adhering to the resin sheet which is brought into direct contact with a surface of the material to be processed, and prevent the contaminant from again adhering to the surface of the material to be processed after the material to be processed is carried into the thermal contact-bonding apparatus for a thermal contact-bonding processing, thereby preventing product failure.

The present invention provides, as a means for solving the above problems, a thermal contact-bonding apparatus in which the control means is a means for sucking the resin sheet toward a side of the upper chamber.

The thermal contact-bonding apparatus can easily prevent contamination on a surface of a hot plate from adhering to a resin sheet by only providing a sucking control means in an upper chamber of a known thermal contact-bonding apparatus.

According to the present invention as a means for solving the above problems, it is necessary to separate at least a part of a surface of a hot plate from a resin sheet, and a depressed portion may be provided at least a part of the surface of the hot plate. For example, a depressed portion may be formed in an area on the surface of the hot plate to be in contact with a print paint printed on a back surface of the above-mentioned photovoltaic device. Thus, the printing area on the back surface of a material to be processed is not in contact with the surface of the hot plate, and the print paint does not adhere to the hot plate. Contaminant, dust, or the like easily deposits in the depressed portion. However, the surface of the hot plate and the resin sheet are separated at the depressed portion when the material to be processed is not charged, to thereby prevent adhering of the contaminant, dust, or the like to the material to be processed via the resin sheet.

DETAILED DESCRIPTION OF THE PREFERRED EMBODIMENTS

Hereinafter, the present invention will be described in detail with reference to embodiments of the present invention. However, the embodiments represent typical modes of the present invention, and the present invention is not limited to the embodiments.

Embodiment 1

FIG. 1 and FIGS. 2A to 2F are schematic sectional view illustrating a thermal contact-bonding apparatus and a thermal contact-bonding method according to Embodiment 1. Embodiment 1 relates to a thermal contact-bonding method of arranging a conductive adhesive-coated metal wire as disclosed in U.S. Pat. No. 4,260,429 on a light-receiving surface of a photovoltaic device, and heating and pressing the whole with a heater, to thereby fix the metal wire on the light-receiving surface of the photovoltaic device.

Figure 1:
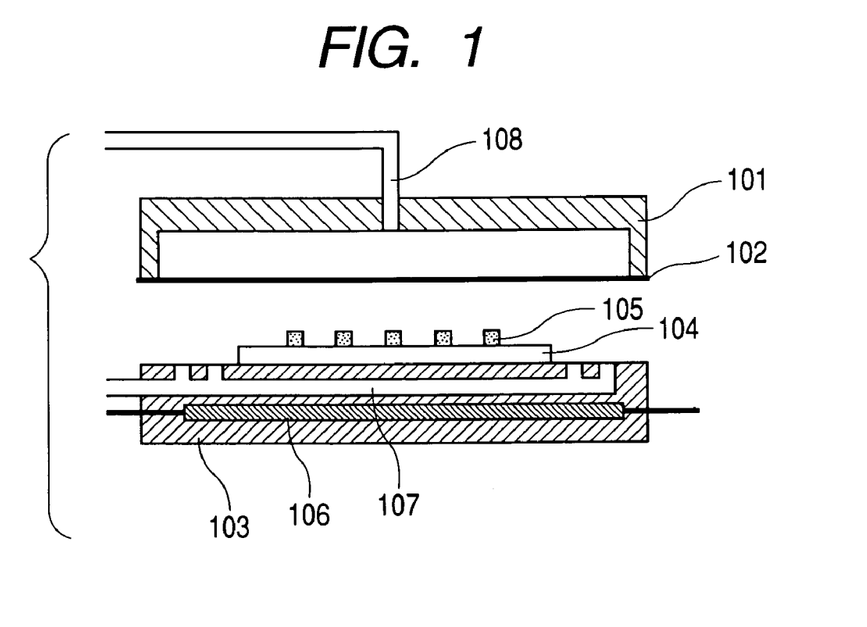
FIG. 1 is a schematic sectional view illustrating a thermal contact-bonding apparatus according to Embodiment 1.

In FIG. 1, an upper chamber 101 is provided with a depressed portion (400 mm×400 mm×depth of 5 mm) at a lower portion of the upper chamber. A resin sheet 102 is composed of a glass fabric sheet impregnated with 55 parts by weight of a polytetrafluoroethylene (PTFE) resin and a polytetrafluoroethylene (PTFE) resin tape attached to the central portion (380 mm×380 mm), which a material to be processed is brought into contact with, of the sheet. The resin sheet 102 is attached to a rim of the lower portion of the upper chamber 101. A pipe 108 is provided for supplying air to and evacuating air from a space enclosed by the upper chamber 101 and the resin sheet 102, and a valve (not shown) for switching the inside of the upper chamber to atmospheric pressure or vacuum is provided. A hot plate 103 (420 mm×420 mm) is provided with a heater 106 controlled to suppress fluctuation of surface temperature at 200° C., and a plurality of holes 107 for evacuating the space between the resin sheet 102 and the hot plate 103. The holes 107 are provided with a valve (not shown) for switching the space between the resin sheet 102 and the hot plate 103 to atmospheric pressure or vacuum. As materials to be processed 104 and 105 for thermal contact-bonding, a photovoltaic device 104 is placed on the hot plate 103 with a non-light-receiving surface of the device facing down, wherein the photovoltaic device 104 (200 mm×200 mm×thickness of 0.5 mm) has a conductive adhesive-coated metal wire 105 (diameter of 0.2 mm) arranged on a light-receiving surface in advance. The conductive adhesive-coated metal wire is produced by preparing a conductive adhesive by dispersing with a paint shaker, 35 parts by weight of carbon black, 59 parts by weight of a urethane resin as a binder, 9.5 parts by weight of isocyanate as a curing agent, 12 parts by weight of butyl ether acetate as a solvent, and 8 parts by weight of methyl ethyl ketone; applying the conductive adhesive to a copper wire (diameter of 0.1 mm); and then drying the conductive adhesive. The photovoltaic device 104 has a number for controlled production printed on the non-light-receiving surface by ink jet printing. A printed paint is a paint prepared by dispersing pigments or dyes such as carbon black, chromium complex salt dyes, and boron compounds in a solvent such as methanol, methyl ethyl ketone, or the like.

FIGS. 2A to 2F are schematic sectional views each illustrating the steps of a thermal contact-bonding method of the present invention.

Figure 2A:
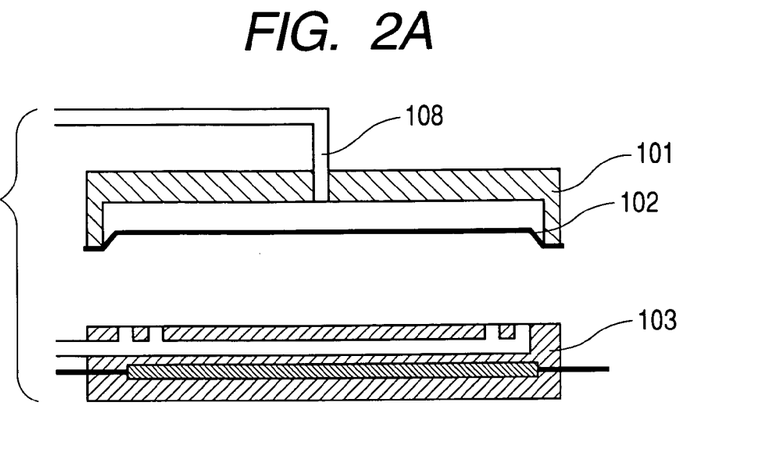
FIGS. 2A, 2B, 2C, 2D, 2E and 2F are schematic sectional views illustrating the steps of a thermal contact-bonding method according to Embodiment 1.

FIG. 2A shows a state of a thermal contact-bonding apparatus before a material to be processed is carried thereinto, in which an upper chamber 101 is raised. A hot plate 103 is heated such that a surface temperature becomes 200° C. A resin film 102 is sucked to the inside of the upper chamber 101 by evacuating the upper chamber 101 to set the inside of the upper chamber to a vacuum state through a pipe 108.

Figure 2B:
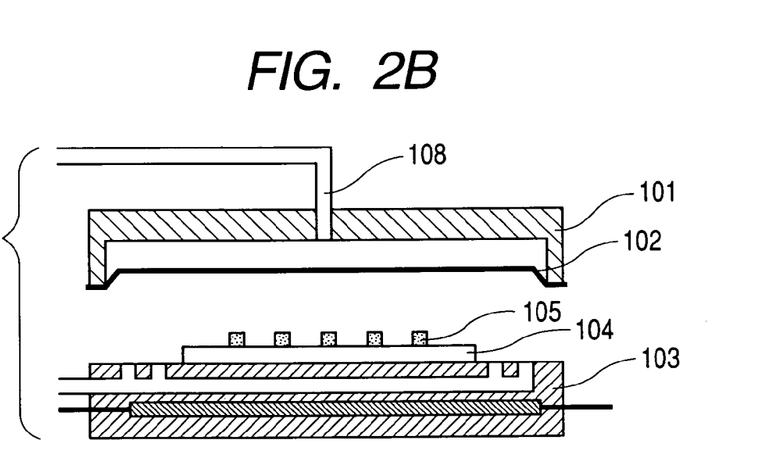

FIG. 2B shows a state of the material to be processed carried into the thermal contact-bonding apparatus and placed on the hot plate 103. The material to be processed consists of a photovoltaic device 104 having a conductive adhesive-coated metal wire 105 arranged on a light-receiving surface in advance.

Figure 2C:
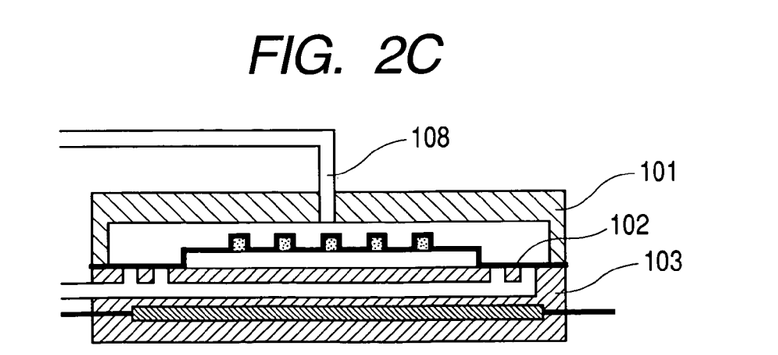

FIG. 2C shows a state of the upper chamber 101 pressed against the hot plate 103 after returning the upper chamber to atmospheric pressure by switching a valve and lowering the upper chamber. A space between a resin film 102 and the hot plate 103 is maintained under vacuum through holes 107 provided in the hot plate 103, and the resin sheet 102 is pressed against the material to be processed at a pressure of about 0.1 MPa. The conductive adhesive-coated metal wire 105 is fixed on the photovoltaic device 104 by conducting the above-mentioned thermal contact-bonding processing for 90 seconds.

Figure 2D:
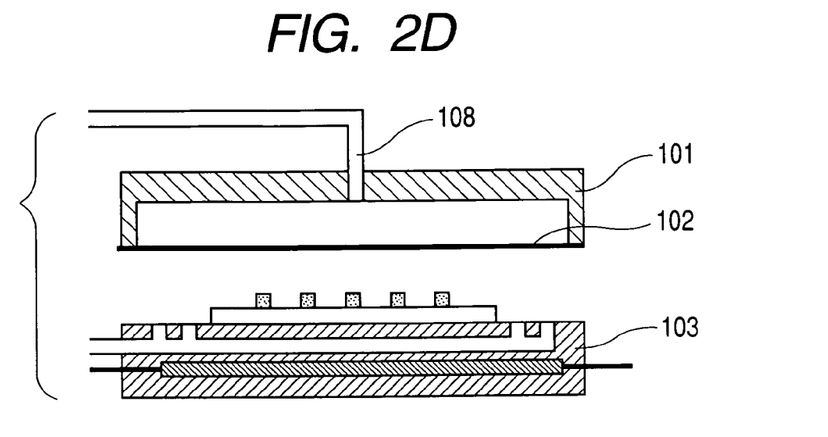

FIG. 2D shows a state of the upper chamber raised after the thermal contact-bonding processing.

Figure 2E:
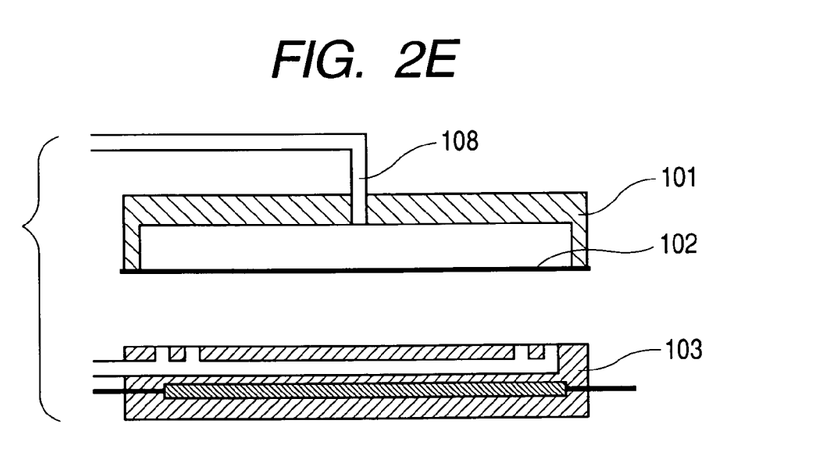

FIG. 2E shows a state of the processed material carried out of the thermal contact-bonding apparatus. At this time, a paint of the number printed for controlled production on a non-light-receiving surface of the photovoltaic device, which is the processed material, is transferred to a surface of the hot plate 103 (not shown).

Figure 2F:
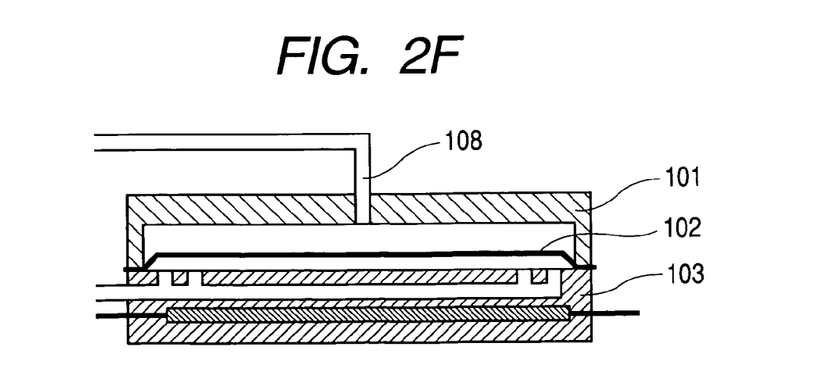

FIG. 2F shows a state of the thermal contact-bonding apparatus in which a subsequent material to be processed is not carried into. The upper chamber 101 is evacuated, and the resin sheet 102 is sucked to the inside of the upper chamber 101. The upper chamber is then lowered, and the upper chamber 101 and the resin sheet 102 are heated by the hot plate 103.

In a stand-by state of not carrying thereinto the material to be processed, the above-mentioned thermal contact-bonding method prevents contact between the resin sheet 102 and the surface of the hot plate 103 in the thermal contact-bonding apparatus by sucking the resin sheet 102 to the inside of the upper chamber 101 as shown in FIG. 2F. Thus, contaminant only adheres to the hot plate, and does not adhere again to the surface of material to be processed.

In Embodiment 1, a paint of the number for controlled production transferred from the material to be processed is regarded as the contaminant on the hot plate 103. In the prior art, there is a problem of depositing dust or the like of the environment on the surface of the hot plate and transferring the dust or the like to the material to be processed via the resin sheet since a heating surface is an upper portion of the hot plate. Such a problem of the dust can also be solved by Embodiment 1 of the present invention by separating the resin sheet and the surface of the hot plate from each other.

The thermal contact-bonding apparatus in Embodiment 1 may utilize a known thermal contact-bonding apparatus which heats and presses a material to be processed consisting of a material to be contact-bonded and one or more contact-bonding components, to fix one or more contact-bonding components on the material to be contact-bonded. The known thermal contact-bonding apparatus includes at least: a hot plate having a heating function such as a heater inside; a resin sheet facing the hot plate for pressing a material to be processed; and an upper chamber for supporting the resin sheet and moving the resin sheet upward/downward, forward/backward, left/right, or the like. The material to be processed is pressed by vacuum sucking a space between the hot plate having the material to be processed placed thereon and the resin sheet, and thereby applying an atmospheric pressure (about 0.098 MPa) to a side of the resin sheet opposite to the side in contact with the material to be processed. Specific examples of the known thermal contact-bonding apparatus include: a double vacuum apparatus, disclosed in Japanese Patent Application Laid-Open No. H05-031743, and thermal contact-bonding apparatuses for bonding an electrode material to a photovoltaic device, disclosed in Japanese Patent Application Laid-Open Nos. H07-335921 and H08-306946.

The resin sheet in Embodiment 1 may be a known resin sheet having heat resistance and durability for maintaining a space between the resin sheet and the hot plate under vacuum and for applying a uniform pressure against a material to be processed having an uneven surface. Specific examples of a material suitably used for the resin sheet include: a heat resistant rubber material such as silicone rubber, fluorine rubber, and neoprene rubber; and a composite material prepared by impregnating heat resistant fibers such as glass fibers and Kevlar fibers with a heat resistant resin such as a silicone resin and a fluorine resin. A portion of the resin sheet to be brought into contact with the material to be processed may be provided with a releasing film having characteristics such as heat resistance, low friction coefficient, and non-adhesiveness. Specific examples of the releasing film suitably used include fluorine resin films such as of a polytetrafluoroethylene (PTFE) resin, a tetrafluoroethylene-perfluoroalkyl vinyl ether copolymer (PFA) resin, a tetrafluoroethylene-hexafluoropropylene copolymer (FEP) resin, and a tetrafluoroethylene-ethylene copolymer (ETFE) resin.

The thickness and elasticity of a resin sheet is designed as desired, but the thickness is preferably about 0.3 mm to 5 mm. The sheet thickness of less than 0.3 mm provides a small compressive strain not to apply a uniform pressure to uneven portions of a material to be processed. In contrast, the sheet thickness exceeding 5 mm provides a large compressive strain not to applying a sufficient pressure to a coating wire, thereby causing difficulties in bonding. A rubber hardness of a rubber material may be changed if the resin sheet is a heat resistant rubber material, and a resin content may be changed if the resin sheet is a composite material so that a pressure distribution on the uneven portions of the material to be processed can be controlled, whereby the shape of the resin sheet can be controlled after thermal contact-bonding. A thickness of a releasing film must not impair the elasticity of the resin sheet, and is desirably about 0.2 mm or less.

Embodiment 2

Figure 3:
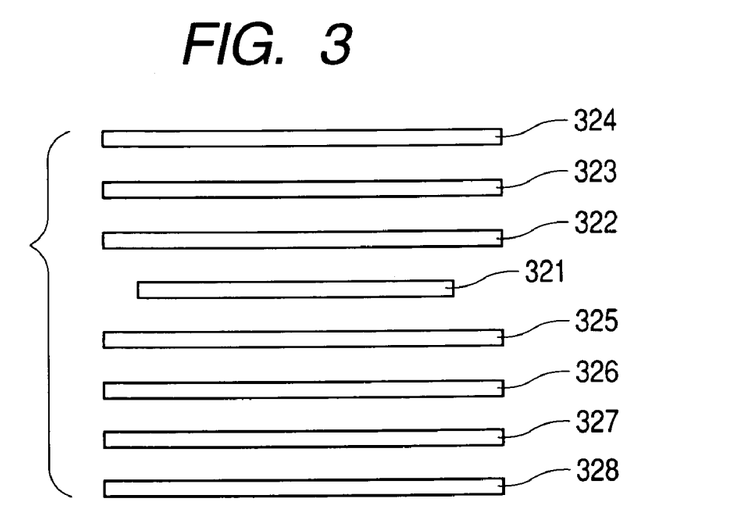
FIG. 3 is a schematic sectional view illustrating a material to be processed according to Embodiment 2.
Figure 4:
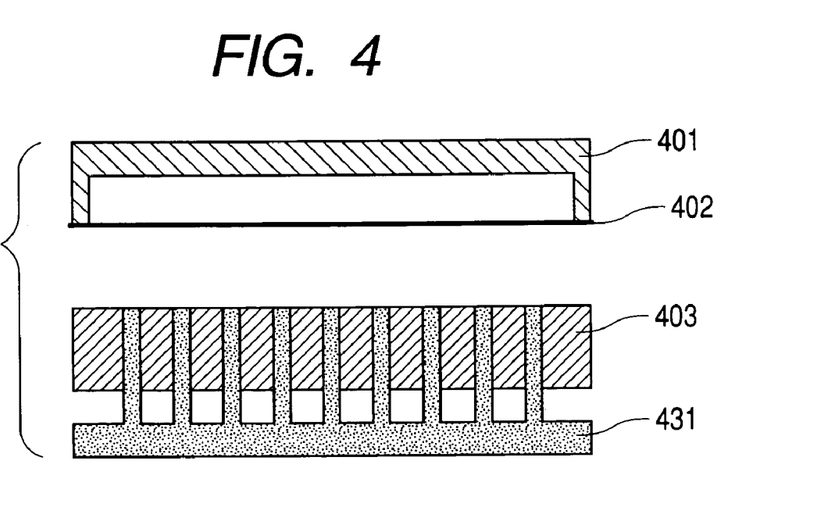
FIG. 4 is a schematic sectional view illustrating a thermal contact-bonding method according to Embodiment 2.

FIG. 3 shows a schematic sectional view illustrating a material to be processed according to Embodiment 2, and FIG. 4 shows a schematic sectional view illustrating a thermal contact-bonding method according to Embodiment 2. Embodiment 2 relates to a coating method using a single vacuum laminator for producing a photovoltaic device module as disclosed in Japanese Patent Application Laid-Open No. H09-191116.

In FIG. 3, a photovoltaic device module is obtained by laminating a photovoltaic device 321; a glass fiber nonwoven fabric 322 (coating weight: 20 g/m$^2$, thickness: 100 μm, acrylic resin binder content: 4.0 wt. %) as a light-receiving surface coating material; an EVA sheet 323 (thickness: 460 μm); an undrawn ETFE film 324 (thickness: 50 μm); an insulating film 326 (thickness: 75 μm) as a back surface coating material; EVA sheets 325 and 327 which are the same as that of used for the surface coating material 323 as adhesives; and Galvalume steel plate 328 (zinc plated steel plate, thickness: 0.27 mm) painted black as a reinforcing plate, in the order of ETFE film 324/EVA sheet 323/glass fiber nonwoven fabric 322/photovoltaic device 321/EVA sheet 325/insulating film 326/EVA sheet 327/reinforcer 328, with the ETFE film 324 being top, and by heating the laminated product at 150° C. for 30 minutes while the laminated product is pressurized using a single vacuum laminator. The EVA sheet used herein is prepared by mixing 1.5 parts by weight of a crosslinking agent, 0.3 parts by weight of a UV absorber, 0.1 parts by weight of a light stabilizer, 0.2 parts by weight of an anti-oxidizing agent, and 1.0 parts by weight of a silane coupling agent with respect to 100 parts by weight of an EVA resin (vinyl acetate content: 33%).

FIG. 4 is a schematic sectional view showing a thermal contact-bonding apparatus according to Embodiment 2. A material to be processed prepared by laminating the above-mentioned materials in the above-mentioned order is placed on a hot plate 403 heated to 150° C. in the thermal contact-bonding apparatus of the present invention. An upper resin sheet fixture (upper chamber) 401 is lowered. Then, a region between the resin film 402 and the hot plate 403 is maintained under vacuum through holes (not shown) provided in the hot plate 403, and the resin sheet 402 is pressurized against the material to be processed at a pressure of about 0.098 MPa.

The material to be processed is subjected to the thermal contact-bonding processing for 30 minutes, to thereby produce a photovoltaic device module having a coating material thermally contact-bonded on both sides of the photovoltaic device.

After the thermal contact-bonding processing, the upper resin sheet fixture 401 is raised and a thermal contact-bonding processing region between the resin film 402 and the hot plate 403 is opened to take out the photovoltaic device module. The upper resin sheet fixture 401 is lowered, and the thermal contact-bonding processing region is closed. The resin sheet 402 is then heated to make the temperature of the thermal contact-bonding apparatus uniform. At this time, a pin 431 provided on the hot plate rises to prevent contact between the resin sheet 402 and the surface of the hot plate 403, thereby the pin prevents adhering of contaminant of the surface coat of the Galvalume steel plate; a peeled coating matter or a metal matter formed from scratches of the steel plate; and EVA or the like adhered to the surface of the hot plate by flowing of EVA or the like from terminal holes provided in the Galvalume steel plate, to a light-receiving surface of the photovoltaic device module via the resin sheet 402.

As mentioned above, preferred embodiments of the present invention can prevent adhering of contaminant or the like deposited on or adhered to the surface of the hot plate to the resin sheet which is brought into direct contact with a surface of the material to be processed; and adhering of the contaminant again on the surface of the material to be processed after the material to be processed is carried into the thermal contact-bonding apparatus for a thermal contact-bonding processing, thereby preventing product failure.

Further, preferred embodiments of the present invention makes it possible to heat the upper chamber and the resin heat in advance by pressing the upper chamber against the hot plate when the material to be processed is not present in the thermal contact-bonding apparatus; and therefore efficiently control temperature change to perform a thermal contact-bonding process under uniform temperature conditions when the material to be processed is charged into the thermal contact-bonding apparatus.

This application claims priority from Japanese Patent Application No. 2003-322563 filed Sep. 16, 2003, which is hereby incorporated by reference herein.

What is claimed is:

1. A thermal contact-bonding method employing a thermal contact-bonding apparatus including at least a hot plate, an upper chamber, and a resin sheet provided at a lower portion of the upper chamber, the method comprising the steps of:
   pressing the upper chamber against the hot plate, while at least a part of a surface of the hot plate is separated from the resin sheet, to be in a stand-by state of the thermal contact-bonding apparatus, for a time of not charging a material to be processed;
   charging the material to be processed between the resin sheet and the hot plate; and
   subjecting the material to be processed to a thermal contact-bonding processing by making a space between the resin sheet and the hot plate under a vacuum state,
   wherein, in the stand-by state,
      1) the surface of the hot plate and the resin sheet are separated by sucking the resin sheet toward a side of the upper chamber, and
      2) the material to be processed is not present between the resin sheet and the hot plate.

2. A thermal contact-bonding method according to claim 1, wherein the material to be processed has a paint printed area on a surface to be placed on the hot plate, and wherein the surface of the hot plate and the resin sheet are separated at least on a surface of the hot plate on which the paint printed area is placed.

3. A thermal contact-bonding method according to claim 2, wherein the material to be processed comprises a photovoltaic device, and a metal wire coated with at least a layer of a conductive adhesive, the metal wire being provided on the photovoltaic device by thermal contact-bonding, and wherein the material to be processed has the paint printed area on a non-light receiving surface of the photovoltaic device.

* * * * *